(12) United States Patent
Zhu et al.

(10) Patent No.: US 8,116,378 B2
(45) Date of Patent: Feb. 14, 2012

(54) VARIABLE LENGTH DECODING METHOD

(75) Inventors: Hong-Bo Zhu, Shanghai (CN); Congxiu Wang, Shanghai (CN)

(73) Assignee: ArcSoft, Inc., Fredmont, CA (US)

( * ) Notice: Subject to any disclaimer, the term of this patent is extended or adjusted under 35 U.S.C. 154(b) by 1419 days.

(21) Appl. No.: 11/639,198

(22) Filed: Dec. 15, 2006

(65) Prior Publication Data
US 2008/0144717 A1   Jun. 19, 2008

(51) Int. Cl.
*H04N 11/04*   (2006.01)

(52) U.S. Cl. ................................................. 375/240.23

(58) Field of Classification Search ........................ None
See application file for complete search history.

(56) References Cited

U.S. PATENT DOCUMENTS

| | | | |
|---|---|---|---|
| 2003/0026335 A1* | 2/2003 | Thyagarajan | 375/240.2 |
| 2005/0156761 A1* | 7/2005 | Oh | 341/67 |

* cited by examiner

*Primary Examiner* — Tung Vo
*Assistant Examiner* — Stephen Smith
(74) *Attorney, Agent, or Firm* — Bacon & Thomas, PLLC

(57) ABSTRACT

The present invention is to provide a variable length decoding method for decoding complete binary tree code, which is implemented to an entropy coding module for executing the process comprising the steps of: procuring a TabIndex to calculate a value $T=\lfloor \log_2(\text{TabIndex}) \rfloor$; reading T bits from a bitstream to obtain a first result M; determining whether or not the result M is smaller than $(\text{TabIndex}-(1<<T))$; if not, obtaining Index equal to $(1<<T)-M-1$; otherwise, reading 1 bits from the bitstream to obtain a second result N; and then obtaining Index equal to $\text{TabIndex}-2\times M-N-1$, so as to decode data stream of video more efficiently and fast.

8 Claims, 9 Drawing Sheets

VARIABLE LENGTH DECODING METHOD

FIELD OF THE INVENTION

The present invention relates to a decoding method, more particularly to a method for decoding variable length code so as to decode data stream of video more efficiently and fast.

PRIOR ART

A typical 'real world' or natural video scene is composed of multiple objects each with their own characteristic shape, depth, texture and illumination, of which the color and brightness is changed along with varying degrees of smoothness throughout the scene. Generally speaking, a visual scene is spatially and temporally continuous, digital video is a representation of a natural visual scene, sampled spatially and temporally. A scene is sampled at a point in time to produce a frame, which represents a complete visual scene at that point in time. The most common format for a sampled frame is a rectangle with the sampling points positioned on grids at the rectangular frame, so the visual quality of the frame is influenced by the number of sampling points. Choosing a coarse sampling grid produces a low-resolution sampled image whilst increasing the number of sampling points will produce a high-resolution image. A moving video is produced by taking rectangular 'snapshots' 10, 11, and 12 of the images at periodic time intervals (e.g. 1/25 or 1/30 second intervals) as shown in FIG. 1. The illusion of motion is created by displaying the frames one after the other at a relatively fast frame rate, for example, 25 or 30 frames per second. A higher temporal sampling rate gives apparently smoother motion in the video scene but requires more frames to be captured and stored.

A monochrome image requires just one number to represent the illumination of a spatial sample. But a color image requires at least three numbers per pixel to represent color accurately. The most common used color model is the YUV color model. The Y component represents the intensity of the image, while the U and V components represent the color differences of the image. Since the human visual system is more sensitive to intensity variations than color variations, the chrominance components (U, V) are spatially downsampled by a factor of 2 in the x and y directions. Typically, a block of 16×16 image pixels (macroblock) comprise a 16×16 luminance block and two 8×8 chrominance blocks.

A PAL-based format image in CIF (Common Intermediate Format) comprises 22×18 macroblocks, each macroblock has 16×16 image pixels. Since the luminance and chrominance components are represented with 8 bit resolution (in range 0-255), the number of bits needed to represent a video frame in CIF format is 22×18×(16×16+2×8×8)×8=1216512 bits. If the video is with 30 frames per second, the data rate will be 1216512×30=36495360 bps. It is an extremely high data rate and is not practical for video recording, transmission and display applications because of the very large storage capacity, transmission channel capacity and hardware performance requirements.

Modern video compression standards, such as ITU-T (Telecommunication Standardization Sector of the International Telecommunication Union) recommendations H.261, H.263, H.264 and the Motion Picture Experts Group recommendations MPEG-1, MPEG-2 and MPEG-4, are all belonging to block-based motion compensation (MC)/discrete cosine transform (DCT) hybrid video coding standard, wherein the motion compensation exploits the temporal redundancy and the DCT exploits the spatial redundancy. Referring to FIG. 2, it shows a typical MC/DCT hybrid video encoder for splitting each picture into macroblocks, which will be coded sequentially in a raster scan order. The first picture of a video sequence is typically coded in intra mode, which typically uses some prediction from region to region within the picture but has no dependence on other pictures. For all remaining pictures, typical inter-picture coding modes are used for most macroblocks. Firstly, the motion compensation module 20 or the intra prediction module 21 generates several blocks as the prediction of the current macroblock. The motion estimation module 22 selects blocks from the reconstructed frames except the reconstructed part of the current coded frame, the displacement vector is called motion vector. While the intra prediction module 21 selects blocks only from the reconstructed part of the current coded frame, and the selected prediction method is called intra-prediction mode. The difference between a current frame and a prediction frame is transformed by a frequency transform (as referring to FIG. 2, a DCT or integer-approximated DCT transform 23 is used to concentrate the energy). The transform coefficients are then scaled, quantized, entropy coded and transmitted together with the prediction side information and some control information. The quantized transform coefficients are then inv-quantized, inv-transformed to obtain the reconstructed residual. The reconstructed residual is added to the prediction to obtain the reconstructed macroblock, which will be used as the prediction for the macroblocks to be coded in future.

Referring to FIG. 3, it shows a typical MC/DCT hybrid video decoder, which is an inverse of the encoder shown in FIG. 2. Firstly, the entropy decoding module 30 decodes the macroblock mode, motion vector, prediction mode, coded block pattern, DCT coefficients etc. from the bit stream. The DCT coefficients are inv-quantized and inv-DCT to form the reconstructed residual. The prediction block is obtained according to the macroblock mode, motion vector and prediction mode. The reconstructed residual is added to the prediction block to form the reconstructed macroblock. The reconstructed macroblock is stored to the picture buffer as the prediction for the macroblock decoded in future. When all macroblocks in a picture are decoded, the reconstructed picture is outputted for display.

Again referring to FIG. 2, in the entropy coding module 24, all syntax elements are coded by using a variable length code coder or an arithmetic coder. For the H.264 baseline profile, all syntax elements except the quantized DCT coefficients are mapped to the signed numbers or unsigned numbers by using a map table as shown in the following table 1, and the numbers are coded by the corresponding exp-golomb codes:

TABLE 1

| signed_num | unsigned_num | exp-golomb code |
|---|---|---|
| 0 | 0 | 1 |
| 1 | 1 | 010 |
| −1 | 2 | 011 |
| 2 | 3 | 00100 |
| −2 | 4 | 00101 |
| 3 | 5 | 00110 |
| −3 | 6 | 00111 |
| 4 | 7 | 0001000 |
| −4 | 8 | 0001001 |
| 5 | 9 | 0001010 |
| −5 | 10 | 0001011 |
| 6 | 11 | 0001100 |
| −6 | 12 | 0001101 |
| 7 | 13 | 0001110 |
| −7 | 14 | 0001111 |
| ... | ... | ... |

The output of the DCT/quantization module is a two-dimensional array. In the VLC (Variable Length Coding) module, the array is converted to a one dimensional array by a zig-zag scan, as shown in FIGS. 4 and 5. In the MPEG-1, MPEG-2 and MPEG-4, the same coding method is used for the quantized DCT coefficients as shown in FIG. 4. Firstly, the one-dimensional array is obtained as [6, 1, 0, 3, −1, 0, 0, 0, 1, 0, 0, 0, 0, 0, 0, 0, 0, −1, 0, . . . ] by a zig-zag scan, which is then converted into [run, level, last] array as [0, 6, 0], [0, 1, 0], [1, 3, 0], [0, −1, 0], [3, 1, 0] and [8, −1, 1], in which the run denotes the zero coefficient number before each non-zero coefficient, the level denotes the non-zero coefficient, and the last denotes whether the non-zero coefficient is the last non-zero coefficient or not (i.e. 1 represents that the non-zero coefficient is the last non-zero coefficient and 0 represents the opposite). The [run, level, last] array is then coded into the bit stream through the entropy coding module 24 by using a given code table. For MPEG-4 inter DCT coefficients, the code table including the variable length code for the inter quantized DCT coefficients and reordered by the leading zeros is shown in the following table 2:

TABLE 2

| Index | run | level | last | code |
|---|---|---|---|---|
| 0 | 0 | 2 | 0 | 1111 |
| 1 | 2 | 1 | 0 | 1110 |
| 2 | 1 | 1 | 0 | 110 |
| 3 | 0 | 1 | 0 | 10 |
| 4 | 0 | 1 | 1 | 0111 |
| 5 | 3 | 1 | 0 | 0110 1 |
| 6 | 4 | 1 | 0 | 0110 0 |
| 7 | 5 | 1 | 0 | 0101 1 |
| 8 | 0 | 3 | 0 | 0101 01 |
| 9 | 1 | 2 | 0 | 0101 00 |
| 10 | 6 | 1 | 0 | 0100 11 |
| 11 | 7 | 1 | 0 | 0100 10 |
| 12 | 8 | 1 | 0 | 0100 01 |
| 13 | 9 | 1 | 0 | 0100 00 |
| 14 | 1 | 1 | 1 | 0011 11 |
| 15 | 2 | 1 | 1 | 0011 10 |
| 16 | 3 | 1 | 1 | 0011 01 |
| 17 | 4 | 1 | 1 | 0011 00 |
| 18 | 0 | 4 | 0 | 0010 111 |
| 19 | 10 | 1 | 0 | 0010 110 |
| 20 | 11 | 1 | 0 | 0010 101 |
| 21 | 12 | 1 | 0 | 0010 100 |
| 22 | 5 | 1 | 1 | 0010 011 |
| 23 | 6 | 1 | 1 | 0010 010 |
| 24 | 7 | 1 | 1 | 0010 001 |
| 25 | 8 | 1 | 1 | 0010 000 |
| 26 | 0 | 5 | 0 | 0001 1111 |
| 27 | 1 | 3 | 0 | 0001 1110 |
| 28 | 2 | 2 | 0 | 0001 1101 |
| 29 | 13 | 1 | 0 | 0001 1100 |
| 30 | 14 | 1 | 0 | 0001 1011 |
| 31 | 9 | 1 | 1 | 0001 1010 |
| 32 | 10 | 1 | 1 | 0001 1001 |
| 33 | 11 | 1 | 1 | 0001 1000 |
| 34 | 12 | 1 | 1 | 0001 0111 |
| 35 | 13 | 1 | 1 | 0001 0110 |
| 36 | 14 | 1 | 1 | 0001 0101 |
| 37 | 15 | 1 | 1 | 0001 0100 |
| 38 | 16 | 1 | 1 | 0001 0011 |
| 39 | 0 | 6 | 0 | 0001 0010 1 |
| 40 | 0 | 7 | 0 | 0001 0010 0 |
| 41 | 3 | 2 | 0 | 0001 0001 1 |
| 42 | 4 | 2 | 0 | 0001 0001 0 |
| 43 | 15 | 1 | 0 | 0001 0000 1 |
| 44 | 16 | 1 | 0 | 0001 0000 0 |
| 45 | 17 | 1 | 0 | 0000 1111 1 |
| 46 | 18 | 1 | 0 | 0000 1111 0 |
| 47 | 19 | 1 | 0 | 0000 1110 1 |
| 48 | 20 | 1 | 0 | 0000 1110 0 |
| 49 | 21 | 1 | 0 | 0000 1101 1 |
| 50 | 22 | 1 | 0 | 0000 1101 0 |
| 51 | 0 | 2 | 1 | 0000 1100 1 |
| 52 | 17 | 1 | 1 | 0000 1100 0 |
| 53 | 18 | 1 | 1 | 0000 1011 1 |
| 54 | 19 | 1 | 1 | 0000 1011 0 |
| 55 | 20 | 1 | 1 | 0000 1010 1 |
| 56 | 21 | 1 | 1 | 0000 1010 0 |
| 57 | 22 | 1 | 1 | 0000 1001 1 |
| 58 | 23 | 1 | 1 | 0000 1001 0 |
| 59 | 24 | 1 | 1 | 0000 1000 1 |
| 60 | 0 | 8 | 0 | 0000 1000 01 |
| 61 | 0 | 9 | 0 | 0000 1000 00 |
| 62 | Escape | | | 0000 011 |
| 63 | 40 | 1 | 1 | 0000 0101 1111 |
| 64 | 39 | 1 | 1 | 0000 0101 1110 |
| 65 | 38 | 1 | 1 | 0000 0101 1101 |
| 66 | 37 | 1 | 1 | 0000 0101 1100 |
| 67 | 36 | 1 | 1 | 0000 0101 1011 |
| 68 | 35 | 1 | 1 | 0000 0101 1010 |
| 69 | 34 | 1 | 1 | 0000 0101 1001 |
| 70 | 33 | 1 | 1 | 0000 0101 1000 |
| 71 | 26 | 1 | 0 | 0000 0101 0111 |
| 72 | 25 | 1 | 0 | 0000 0101 0110 |
| 73 | 10 | 2 | 0 | 0000 0101 0101 |
| 74 | 6 | 3 | 0 | 0000 0101 0100 |
| 75 | 5 | 3 | 0 | 0000 0101 0011 |
| 76 | 4 | 3 | 0 | 0000 0101 0010 |
| 77 | 2 | 4 | 0 | 0000 0101 0001 |
| 78 | 1 | 6 | 0 | 0000 0101 0000 |
| 79 | 32 | 1 | 1 | 0000 0100 111 |
| 80 | 31 | 1 | 1 | 0000 0100 110 |
| 81 | 30 | 1 | 1 | 0000 0100 101 |
| 82 | 29 | 1 | 1 | 0000 0100 100 |
| 83 | 24 | 1 | 0 | 0000 0100 011 |
| 84 | 23 | 1 | 0 | 0000 0100 010 |
| 85 | 1 | 5 | 0 | 0000 0100 001 |
| 86 | 0 | 12 | 0 | 0000 0100 000 |
| 87 | 1 | 4 | 0 | 0000 0011 11 |
| 88 | 2 | 3 | 0 | 0000 0011 10 |
| 89 | 3 | 3 | 0 | 0000 0011 01 |
| 90 | 5 | 2 | 0 | 0000 0011 00 |
| 91 | 6 | 2 | 0 | 0000 0010 11 |
| 92 | 7 | 2 | 0 | 0000 0010 10 |
| 93 | 8 | 2 | 0 | 0000 0010 01 |
| 94 | 9 | 2 | 0 | 0000 0010 00 |
| 95 | 25 | 1 | 1 | 0000 0001 11 |
| 96 | 26 | 1 | 1 | 0000 0001 10 |
| 97 | 27 | 1 | 1 | 0000 0001 01 |
| 98 | 28 | 1 | 1 | 0000 0001 00 |
| 99 | 0 | 10 | 0 | 0000 0000 111 |
| 100 | 0 | 11 | 0 | 0000 0000 110 |
| 101 | 0 | 3 | 1 | 0000 0000 101 |
| 102 | 1 | 2 | 1 | 0000 0000 100 |
| — | — | — | — | — |

In the H.264 baseline profile, the 4×4 integer-approximated DCT is applied, and correspondingly, the 4×4 quantized DCT coefficients are zig-zag scanned into a one-dimensional array. The CAVLC (context adaptive variable length coding) is used to code the one-dimensional array, as shown in FIG. 5. Firstly, the one-dimensional array is obtained as [0, −3, 0, 0, 0, 0, 0, 0, 6, 0, 0, −1, 1, 0, 1, 0] by a zig-zag scan, which is then converted into [run, level, last] array as [1, 3, 0], [6, 6, 0], [2, −1, 0], [0, 1, 0] and [1, 1, 1] for obtaining the following information:

(1) The coefficient number, which is equal to 5 for denoting the number of the non-zero coefficient;

(2) The trailing ones, which is equal to 3 and includes signs 1, 1 and −1 for denoting the consecutive coefficient number with an absolute value 1 in the array in the reverse order, if the value is greater than 3, it is restricted to 3;

(3) The total zeros before the last coefficient, which is equal to 10 for denoting the number of the zero coefficient before the last non-zero coefficient; and
(4) The zeros before, which includes 1, 0, 2, 6 and 1 for denoting the number of zero coefficient before each non-zero coefficient.

Secondly, the non-zero coefficient number and the trailing ones are coded jointly as a single symbol coeffToken, which is obtained by looking up the following table 3, the table used is selected according to the coefficient numbers of the 4×4 block to the left of current block and the 4×4 block to the top of the current block:

TABLE 3

| Code table 1 | | | Code table 2 | | | Code table 3 | | |
|---|---|---|---|---|---|---|---|---|
| code | T1 | num | code | T1 | num | code | T1 | num |
| 1 | 0 | 0 | 11 | 0 | 0 | 1111 | 0 | 0 |
| 01 | 1 | 1 | 10 | 1 | 1 | 1110 | 1 | 1 |
| 001 | 2 | 2 | 011 | 2 | 2 | 1101 | 2 | 2 |
| 0001 1 | 3 | 3 | 0101 | 3 | 3 | 1100 | 3 | 3 |
| 0001 01 | 0 | 1 | 0100 | 3 | 4 | 1011 | 3 | 4 |
| 0001 00 | 1 | 2 | 0011 1 | 1 | 2 | 1010 | 3 | 5 |
| 0000 11 | 3 | 4 | 0011 0 | 3 | 5 | 1001 | 3 | 6 |
| 0000 101 | 2 | 3 | 0010 11 | 0 | 1 | 1000 | 3 | 7 |
| 0000 100 | 3 | 5 | 0010 10 | 1 | 3 | 0111 1 | 1 | 2 |
| 0000 0111 | 0 | 2 | 0010 01 | 2 | 3 | 0111 0 | 2 | 3 |
| 0000 0110 | 1 | 3 | 0010 00 | 3 | 6 | 0110 1 | 3 | 8 |
| 0000 0101 | 2 | 4 | 0001 11 | 0 | 2 | 0110 0 | 1 | 3 |
| 0000 0100 | 3 | 6 | 0001 10 | 1 | 4 | 0101 1 | 2 | 4 |
| 0000 0011 1 | 0 | 3 | 0001 01 | 2 | 4 | 0101 0 | 1 | 4 |
| 0000 0011 0 | 1 | 4 | 0001 00 | 3 | 7 | 0100 1 | 2 | 5 |
| 0000 0010 1 | 2 | 5 | 0000 111 | 0 | 3 | 0100 0 | 1 | 5 |
| 0000 0010 0 | 3 | 7 | 0000 110 | 1 | 5 | 0011 11 | 0 | 1 |
| 0000 0001 11 | 0 | 4 | 0000 101 | 2 | 5 | 0011 10 | 1 | 6 |
| 0000 0001 10 | 1 | 5 | 0000 100 | 3 | 8 | 0011 01 | 2 | 6 |
| 0000 0001 01 | 2 | 6 | 0000 0111 | 0 | 4 | 0011 00 | 3 | 9 |
| 0000 0001 00 | 3 | 8 | 0000 0110 | 1 | 6 | 0010 11 | 0 | 2 |
| 0000 0000 111 | 0 | 5 | 0000 0101 | 2 | 6 | 0010 10 | 1 | 7 |
| 0000 0000 110 | 1 | 6 | 0000 0100 | 0 | 5 | 0010 01 | 2 | 7 |
| 0000 0000 101 | 2 | 7 | 0000 0011 1 | 0 | 6 | 0010 00 | 0 | 3 |
| 0000 0000 100 | 3 | 9 | 0000 0011 0 | 1 | 7 | 0001 111 | 0 | 4 |
| 0000 0000 0111 1 | 0 | 6 | 0000 0010 1 | 2 | 7 | 0001 110 | 1 | 8 |
| 0000 0000 0111 0 | 1 | 7 | 0000 0010 0 | 3 | 9 | 0001 101 | 2 | 8 |
| 0000 0000 0110 1 | 2 | 8 | 0000 0001 111 | 0 | 7 | 0001 100 | 3 | 10 |
| 0000 0000 0110 0 | 3 | 10 | 0000 0001 110 | 1 | 8 | 0001 011 | 0 | 5 |
| 0000 0000 0101 1 | 0 | 7 | 0000 0001 101 | 2 | 8 | 0001 010 | 2 | 9 |
| 0000 0000 0101 0 | 1 | 8 | 0000 0001 100 | 3 | 10 | 0001 001 | 0 | 6 |
| 0000 0000 0100 1 | 2 | 9 | 0000 0001 011 | 0 | 8 | 0001 000 | 0 | 7 |
| 0000 0000 0100 0 | 0 | 8 | 0000 0001 010 | 1 | 9 | 0000 1111 | 0 | 8 |
| 0000 0000 0011 11 | 0 | 9 | 0000 0001 001 | 2 | 9 | 0000 1110 | 1 | 9 |
| 0000 0000 0011 10 | 1 | 9 | 0000 0001 000 | 3 | 11 | 0000 1101 | 2 | 10 |
| 0000 0000 0011 01 | 2 | 10 | 0000 0000 1111 | 0 | 9 | 0000 1100 | 3 | 11 |
| 0000 0000 0011 00 | 3 | 11 | 0000 0000 1110 | 1 | 10 | 0000 1011 | 0 | 9 |
| 0000 0000 0010 11 | 0 | 10 | 0000 0000 1101 | 2 | 10 | 0000 1010 | 1 | 10 |
| 0000 0000 0010 10 | 1 | 10 | 0000 0000 1100 | 3 | 12 | 0000 1001 | 2 | 11 |
| 0000 0000 0010 01 | 2 | 11 | 0000 0000 1011 | 0 | 10 | 0000 1000 | 3 | 12 |
| 0000 0000 0010 00 | 3 | 12 | 0000 0000 1010 | 1 | 11 | 0000 0111 1 | 0 | 10 |
| 0000 0000 0001 111 | 0 | 11 | 0000 0000 1001 | 2 | 11 | 0000 0111 0 | 1 | 11 |
| 0000 0000 0001 110 | 1 | 11 | 0000 0000 1000 | 0 | 11 | 0000 0110 1 | 2 | 12 |
| 0000 0000 0001 101 | 2 | 12 | 0000 0000 0111 1 | 0 | 12 | 0000 0110 0 | 3 | 13 |
| 0000 0000 0001 100 | 3 | 13 | 0000 0000 0111 0 | 1 | 12 | 0000 0101 1 | 0 | 11 |
| 0000 0000 0001 011 | 0 | 12 | 0000 0000 0110 1 | 2 | 12 | 0000 0101 0 | 1 | 12 |
| 0000 0000 0001 010 | 1 | 12 | 0000 0000 0110 0 | 3 | 13 | 0000 0100 1 | 2 | 13 |
| 0000 0000 0001 001 | 2 | 13 | 0000 0000 0101 1 | 0 | 13 | 0000 0100 0 | 0 | 12 |
| 0000 0000 0001 000 | 3 | 14 | 0000 0000 0101 0 | 1 | 13 | 0000 0011 1 | 1 | 13 |
| 0000 0000 0000 1111 | 0 | 13 | 0000 0000 0100 1 | 2 | 13 | 0000 0011 01 | 0 | 13 |
| 0000 0000 0000 1110 | 1 | 14 | 0000 0000 0100 0 | 3 | 14 | 0000 0011 00 | 1 | 14 |
| 0000 0000 0000 1101 | 2 | 14 | 0000 0000 0011 1 | 0 | 14 | 0000 0010 11 | 2 | 14 |
| 0000 0000 0000 1100 | 3 | 15 | 0000 0000 0011 0 | 2 | 14 | 0000 0010 10 | 3 | 14 |
| 0000 0000 0000 1011 | 0 | 14 | 0000 0000 0010 11 | 1 | 14 | 0000 0010 01 | 0 | 14 |
| 0000 0000 0000 1010 | 1 | 15 | 0000 0000 0010 10 | 2 | 15 | 0000 0010 00 | 1 | 15 |
| 0000 0000 0000 1001 | 2 | 15 | 0000 0000 0010 01 | 0 | 15 | 0000 0001 11 | 2 | 15 |
| 0000 0000 0000 1000 | 3 | 16 | 0000 0000 0010 00 | 1 | 15 | 0000 0001 10 | 3 | 15 |
| 0000 0000 0000 0111 | 0 | 15 | 0000 0000 0001 11 | 0 | 16 | 0000 0001 01 | 0 | 15 |
| 0000 0000 0000 0110 | 1 | 16 | 0000 0000 0001 10 | 1 | 16 | 0000 0001 00 | 1 | 16 |
| 0000 0000 0000 0101 | 2 | 16 | 0000 0000 0001 01 | 2 | 16 | 0000 0000 11 | 2 | 16 |
| 0000 0000 0000 0100 | 0 | 16 | 0000 0000 0001 00 | 3 | 16 | 0000 0000 10 | 3 | 16 |
| 0000 0000 0000 001 | 1 | 13 | 0000 0000 0000 1 | 3 | 15 | 0000 0000 01 | 0 | 16 | the signs of the trailing ones 1, 1 and −1 are coded and the residual coefficients (i.e. the other non-zero coefficients 6 and −3) except the trailing ones are coded by using the golomb-rice code. The code table for the total zeros equal to 10 is selected according to the non-zero coefficient number as shown in the following total zeros table 4 for 4×4 block when the coefficient number is equal to 5:

TABLE 4

| Total zeros | TotalCoeff(coeff_token) | | | | | | | |
|---|---|---|---|---|---|---|---|---|
| | 1 | 2 | 3 | 4 | 5 | 6 | 7 | 8 |
| 0 | 1 | 111 | 0101 | 0001 1 | 0101 | 0000 01 | 0000 01 | 0000 01 |
| 1 | 011 | 110 | 111 | 111 | 0100 | 0000 1 | 0000 1 | 0001 |
| 2 | 010 | 101 | 110 | 0101 | 0011 | 111 | 101 | 0000 1 |
| 3 | 0011 | 100 | 101 | 0100 | 111 | 110 | 100 | 011 |
| 4 | 0010 | 011 | 0100 | 110 | 110 | 101 | 011 | 11 |
| 5 | 0001 1 | 0101 | 0011 | 101 | 101 | 100 | 11 | 10 |
| 6 | 0001 0 | 0100 | 100 | 100 | 100 | 011 | 010 | 010 |
| 7 | 0000 11 | 0011 | 011 | 0011 | 011 | 010 | 0001 | 001 |
| 8 | 0000 10 | 0010 | 0010 | 0010 | 0010 | 0001 | 001 | 0000 00 |
| 9 | 0000 011 | 0001 1 | 0001 1 | 0010 | 0000 1 | 001 | 0000 00 | |
| 10 | 0000 010 | 0001 0 | 0001 0 | 0001 0 | 0001 | 0000 00 | | |
| 11 | 0000 0011 | 0000 11 | 0000 01 | 0000 1 | 0000 0 | | | |
| 12 | 0000 0010 | 0000 10 | 0000 1 | 0000 0 | | | | |
| 13 | 0000 0001 1 | 0000 01 | 0000 00 | | | | | |
| 14 | 0000 0001 0 | 0000 00 | | | | | | |
| 15 | 0000 0000 1 | | | | | | | |

| Total zeros | TotalCoeff(coeff_token) | | | | | | |
|---|---|---|---|---|---|---|---|
| | 9 | 10 | 11 | 12 | 13 | 14 | 15 |
| 0 | 0000 01 | 0000 1 | 0000 | 0000 | 000 | 00 | 0 |
| 1 | 0000 00 | 0000 0 | 0001 | 0001 | 001 | 01 | 1 |
| 2 | 0001 | 001 | 001 | 01 | 1 | 1 | |
| 3 | 11 | 11 | 010 | 1 | 01 | | |
| 4 | 10 | 10 | 1 | 001 | | | |
| 5 | 001 | 01 | 011 | | | | |
| 6 | 01 | 0001 | | | | | |
| 7 | 0000 1 | | | | | | | and the zeros before (zeroBefore, zeroLeft) (1, 10), (0, 9), (2, 9) and (6, 7) are coded by using the following table 5 of variable length code for 4×4 block, and the selection of the code table is based on the non-coded zero coefficient number:

TABLE 5

| zeroBefore | zeroLeft | | | | | | |
|---|---|---|---|---|---|---|---|
| | 1 | 2 | 3 | 4 | 5 | 6 | >6 |
| 0 | 1 | 1 | 11 | 11 | 11 | 11 | 111 |
| 1 | 0 | 01 | 10 | 10 | 10 | 000 | 110 |
| 2 | — | 00 | 01 | 01 | 011 | 001 | 101 |
| 3 | — | — | 00 | 001 | 010 | 011 | 100 |
| 4 | — | — | — | 000 | 001 | 010 | 011 |
| 5 | — | — | — | — | 000 | 101 | 010 |
| 6 | — | — | — | — | — | 100 | 001 |
| 7 | — | — | — | — | — | — | 0001 |
| 8 | — | — | — | — | — | — | 00001 |
| 9 | — | — | — | — | — | — | 000001 |
| 10 | — | — | — | — | — | — | 0000001 |
| 11 | — | — | — | — | — | — | 00000001 |
| 12 | — | — | — | — | — | — | 000000001 |
| 13 | — | — | — | — | — | — | 0000000001 |
| 14 | — | — | — | — | — | — | 00000000001 |

As mentioned above, since in the entropy coding module 24 all syntax elements are coded by using a variable length code coder to convert two-dimensional array of the quantized DCT coefficients outputted by the DCT/quantization module to one dimensional array through a zig-zag scan and lots of tables for obtaining the information needed, it therefore inevitably has to take a considerable time and effort in decoding bit stream of the video in the entropy decoding module 30, which in turn will cause the video to be displayed in an inefficient condition.

SUMMARY OF THE INVENTION

In view of the foregoing shortcomings of the prior art, the inventor of the present invention based on years of experience to conduct extensive researches and experiments and finally invented a variable length decoding method so as to decode data stream of video more efficiently and fast.

A primary objective of the present invention is to provide a method for decoding complete binary tree code, of which the process includes the steps of: procuring a TabIndex to calculate a value $T=\lfloor \log_2(\text{TabIndex}) \rfloor$; reading T bits from a bitstream to obtain a first result M; determining whether or not the result M is smaller than (TabIndex-(1<<T); if not, obtaining Index equal to (1<<T)-M-1; otherwise, reading 1 bits from the bitstream to obtain a second result N; and then obtaining Index equal to TabIndex-2×M-N-1.

Another objective of the present invention is to provide a method further comprising a first decoding procedure for applying to the coeffToken decoding in the H.264, the motion vector and DCT coefficient decoding in MPEG-4, etc., which includes the steps of: obtaining leading zero number, namely LZ num, from the current bitstream; looking up a first table having a plurality of fields of baseIndex and TabIndex by using the LZ Num as an index to obtain the corresponding baseIndex and TabIndex; proceeding with the decoding process of complete binary tree code with respect to the bitstream to obtain the index from the bitstream according to the TabIndex; adding the index obtained from the decoding process to the baseIndex; and looking up a second table having a plurality of fields of syntax elements by using the addition result of the index and the baseIndex as an index to obtain the final result of the syntax elements.

Still Another objective of the present invention is to provide a method further comprising a second decoding procedure for applying to the totalZeros and zeroLeft decoding in the H.264, which includes the steps of: proceeding with the decoding process of complete binary tree code with respect to the bitstream to obtain the index from the bitstream according to the TabIndex; determining whether or not the index is equal to TabIndex-1, if not, looking up a third table having a plurality of fields of total zeros by using the index to obtain the final result of total zeros; otherwise, obtaining leading zero number, namely LZ num, from the current bitstream, adding the LZ num to the index (i.e. TabIndex-1), and looking up the third table by using the sum of LZ num and TabIndex-1 to obtain the final result of the total zeros.

To make it easier for our examiner to understand the objective of the invention, its structure, innovative features, and performance, we use a preferred embodiment together with the attached drawings for the detailed description of the invention.

BRIEF DESCRIPTION OF THE DRAWINGS

Figures 4, 5:
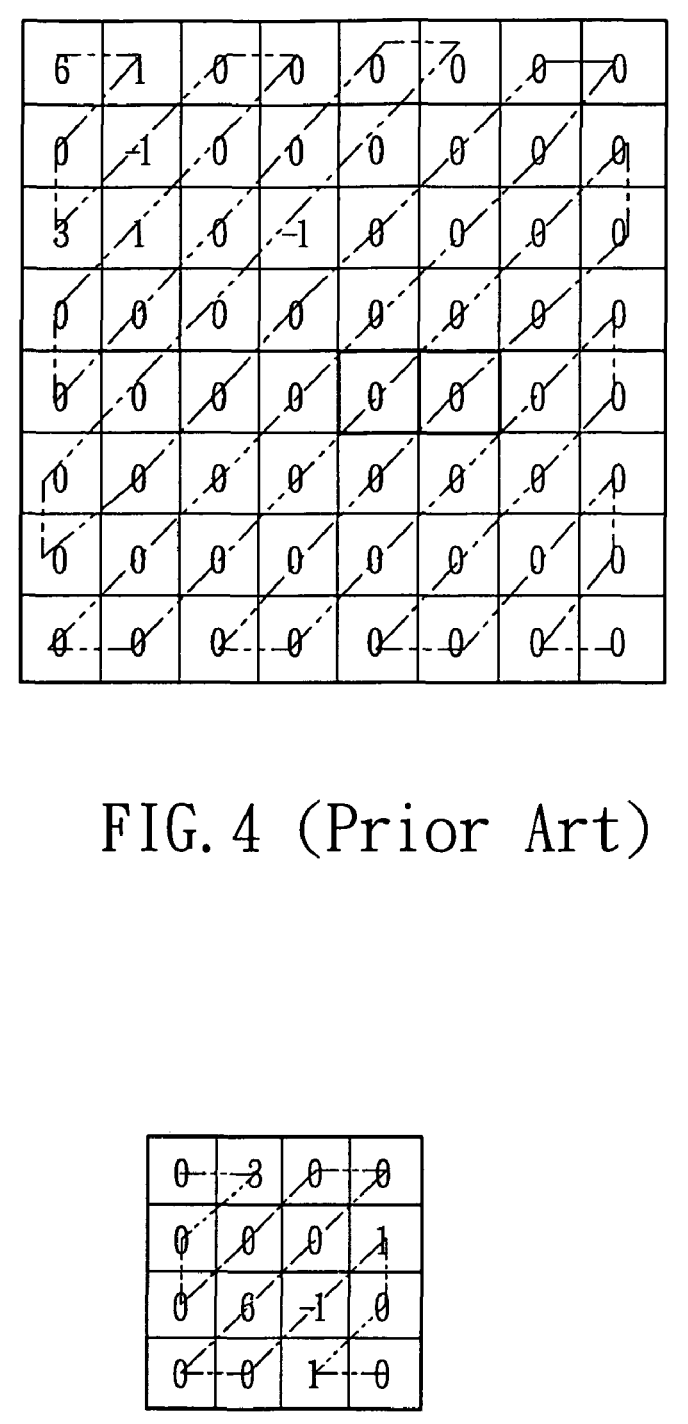

FIG. 4 is a schematic view of zig-zag scan for a 8×8 quantized DCT coefficient block;
FIG. 5 is a schematic view of zig-zag scan for a 4×4 quantized DCT coefficient block.

DETAILED DESCRIPTION OF THE PREFERRED EMBODIMENTS

In a preferred embodiment of the present invention, complete binary tree codes are established as illustrated in the following table 6 and are indexed by TabIndex from 2 to 21:

TABLE 6

| index | TabIndex | | | | | | | | | | |
|---|---|---|---|---|---|---|---|---|---|---|---|
| | 1 | 2 | 3 | 4 | 5 | 6 | 7 | 8 | 9 | 10 | 11 |
| 0 | | 1 | 1 | 11 | 11 | 11 | 11 | 111 | 111 | 111 | 111 |
| 1 | | 0 | 01 | 10 | 10 | 10 | 101 | 110 | 110 | 110 | 110 |
| 2 | | | 00 | 01 | 01 | 011 | 100 | 101 | 101 | 101 | 101 |
| 3 | | | | 00 | 001 | 010 | 011 | 100 | 100 | 100 | 100 |
| 4 | | | | | 000 | 001 | 010 | 011 | 011 | 011 | 011 |
| 5 | | | | | | 000 | 001 | 010 | 010 | 010 | 0101 |
| 6 | | | | | | | 000 | 001 | 001 | 0011 | 0100 |
| 7 | | | | | | | | 000 | 0001 | 0010 | 0011 |
| 8 | | | | | | | | | 0000 | 0001 | 0010 |
| 9 | | | | | | | | | | 0000 | 0001 |
| 10 | | | | | | | | | | | 0000 |

Figure 1:
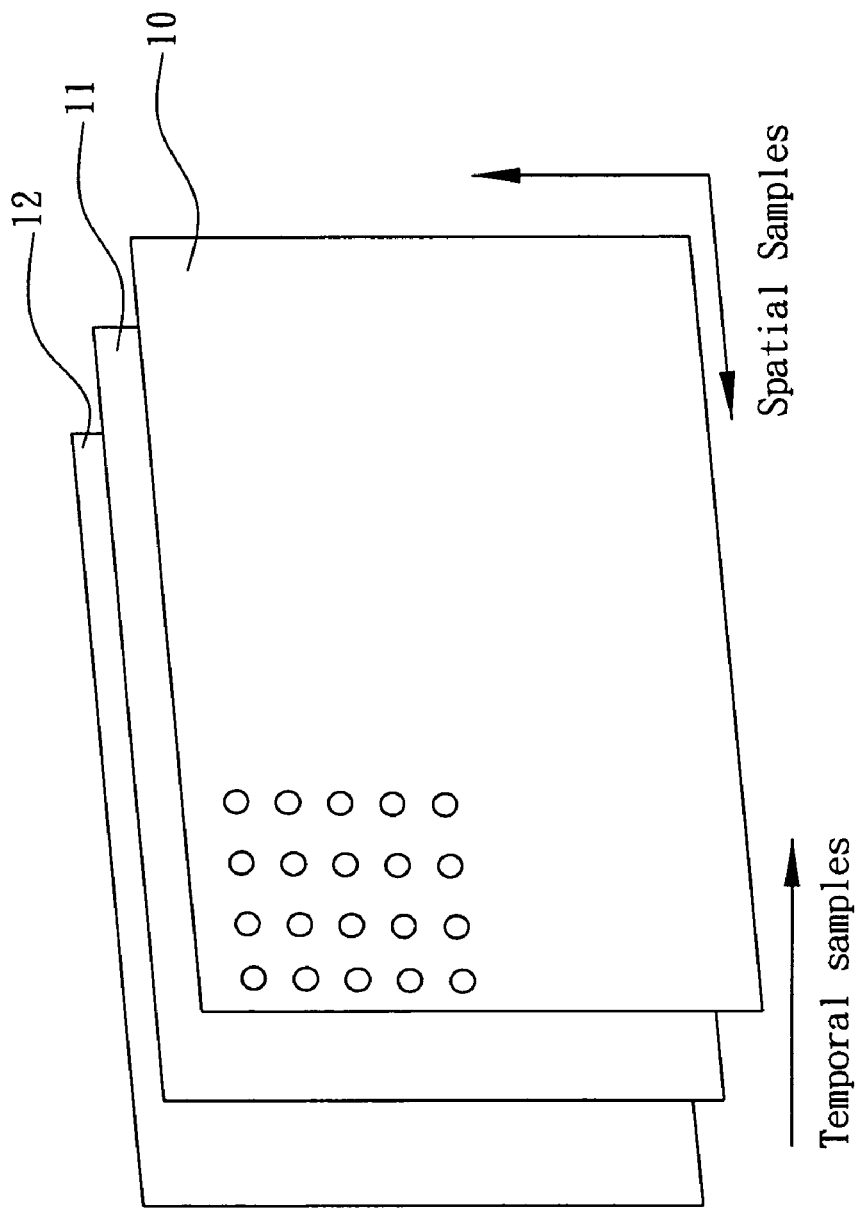
FIG. 1 is a schematic view of frames of digital video by temporally and spatially sampling natural scene.
Figure 2:
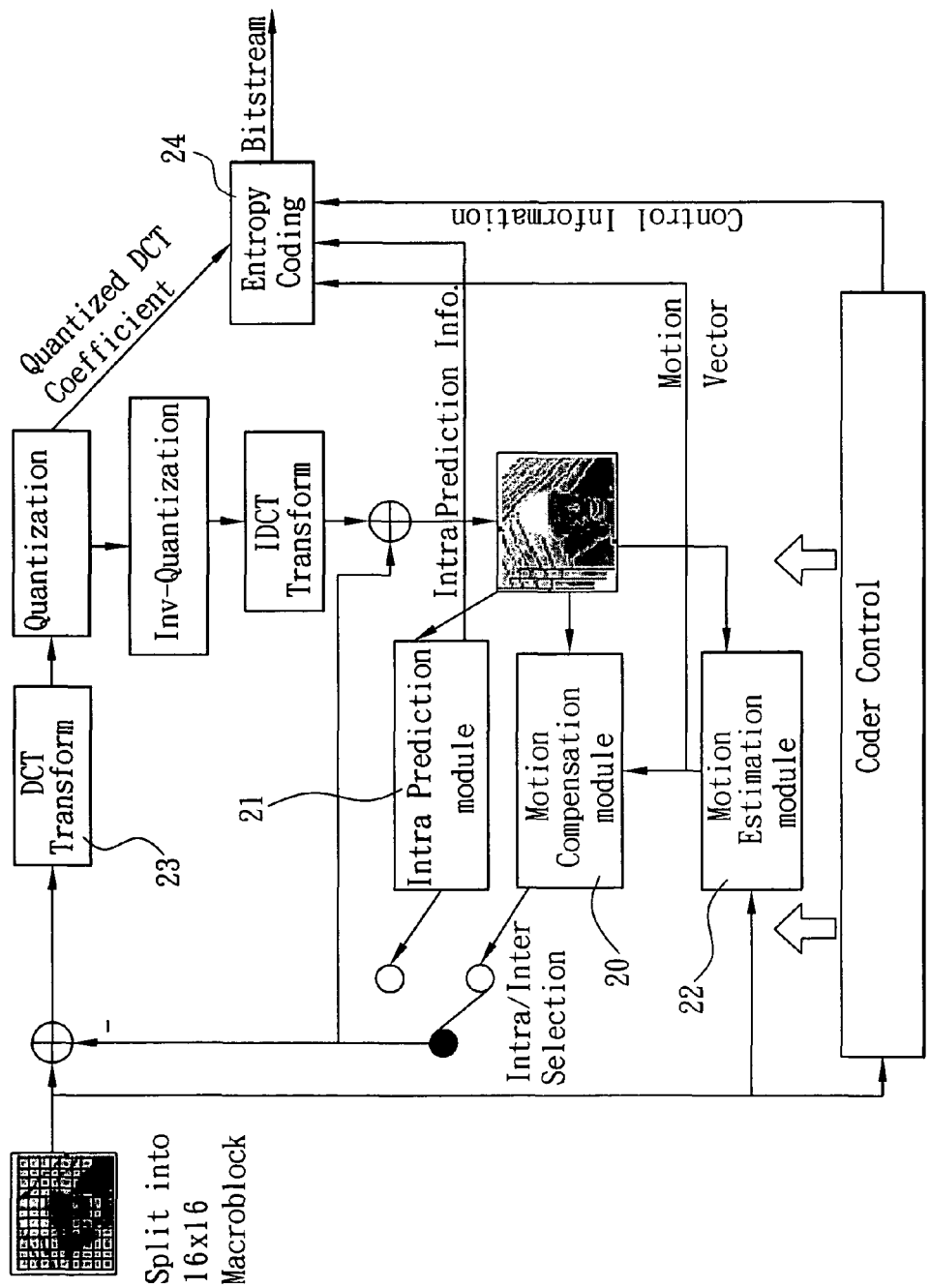
FIG. 2 is a block diagram of a MC/DCT video encoder.
Figure 3:
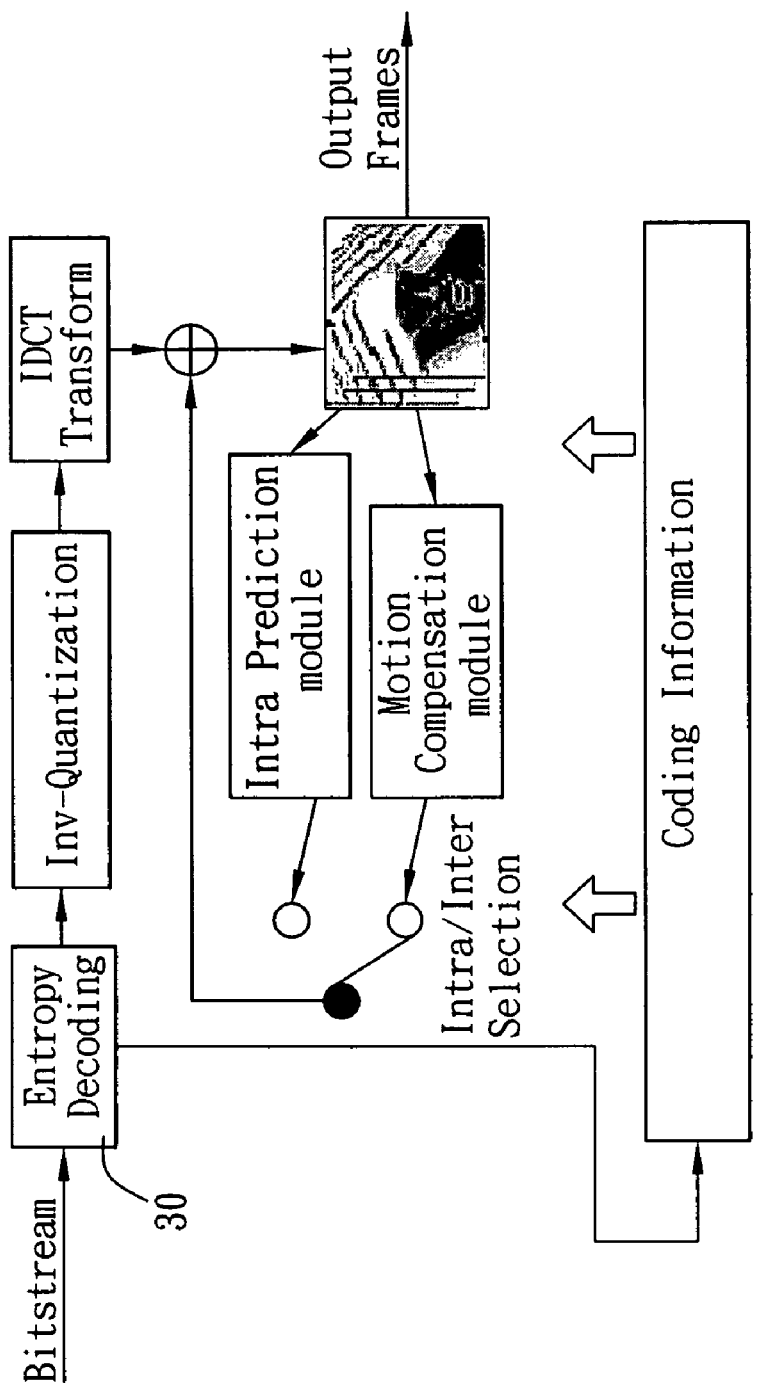
FIG. 3 is a block diagram of a MC/DCT video decoder.
Figure 6:
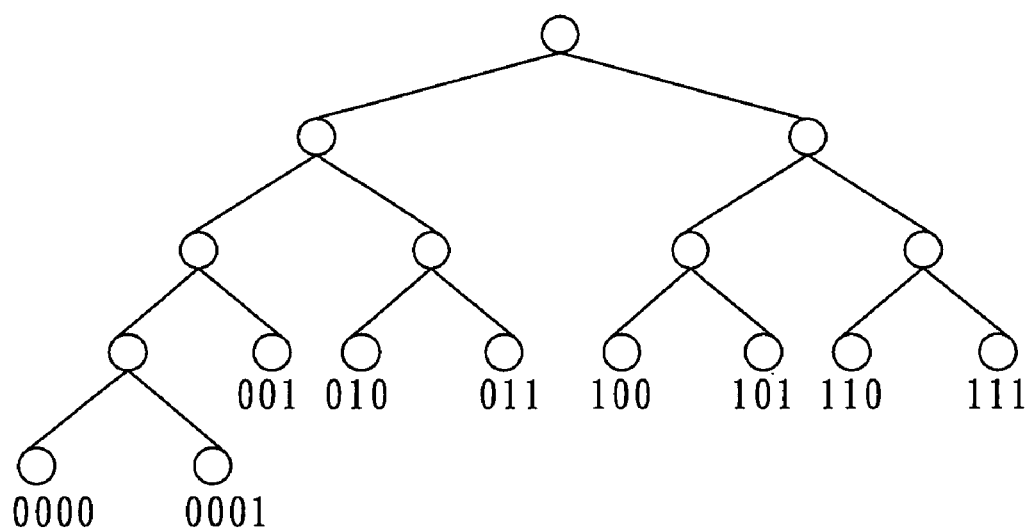
FIG. 6 is a schematic view of a complete binary tree with TabIndex 9.
Figure 7:
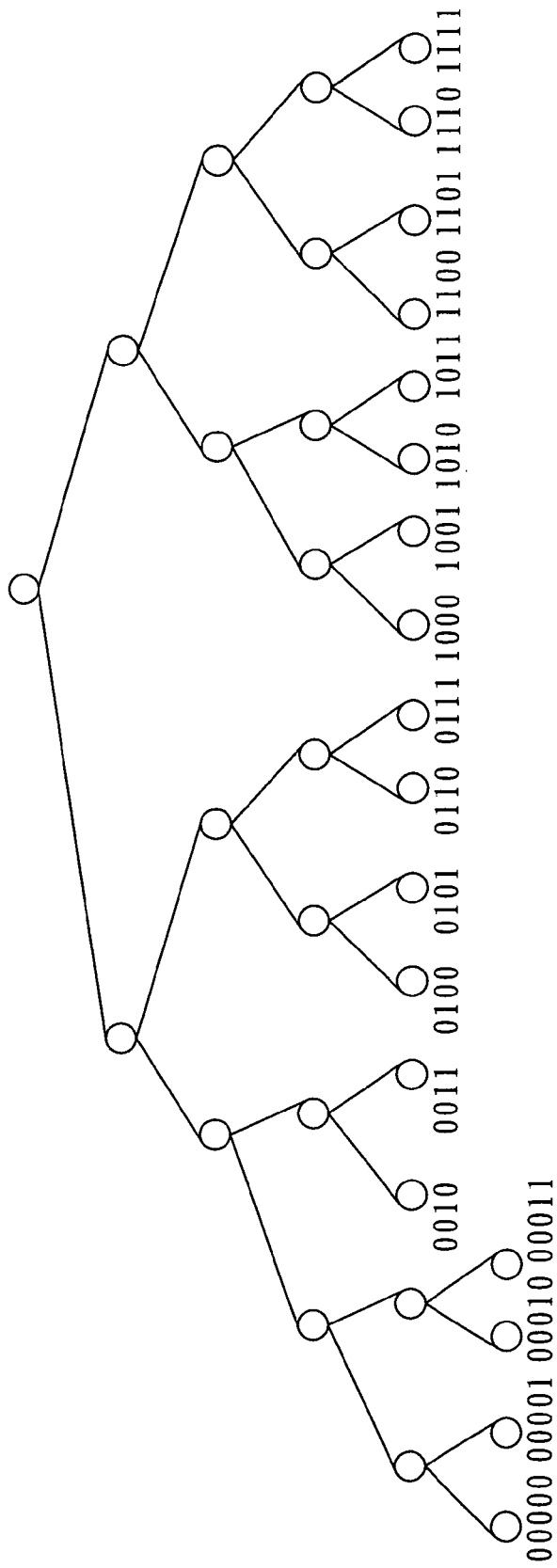
FIG. 7 is a schematic view of a complete binary tree with TabIndex 18.

| index | TabIndex | | | | | | | | | |
|---|---|---|---|---|---|---|---|---|---|---|
| | 12 | 13 | 14 | 15 | 16 | 17 | 18 | 19 | 20 | 21 |
| 0 | 111 | 111 | 111 | 111 | 1111 | 1111 | 1111 | 1111 | 1111 | 1111 |
| 1 | 110 | 110 | 110 | 1101 | 1110 | 1110 | 1110 | 1110 | 1110 | 1110 |
| 2 | 101 | 101 | 1011 | 1100 | 1101 | 1101 | 1101 | 1101 | 1101 | 1101 |
| 3 | 100 | 1001 | 1010 | 1011 | 1100 | 1100 | 1100 | 1100 | 1100 | 1100 |
| 4 | 0111 | 1000 | 1001 | 1010 | 1011 | 1011 | 1011 | 1011 | 1011 | 1011 |
| 5 | 0110 | 0111 | 1000 | 1001 | 1010 | 1010 | 1010 | 1010 | 1010 | 1010 |
| 6 | 0101 | 0110 | 0111 | 1000 | 1001 | 1001 | 1001 | 1001 | 1001 | 1001 |
| 7 | 0100 | 0101 | 0110 | 0111 | 1000 | 1000 | 1000 | 1000 | 1000 | 1000 |
| 8 | 0011 | 0100 | 0101 | 0110 | 0111 | 0111 | 0111 | 0111 | 0111 | 0111 |
| 9 | 0010 | 0011 | 0100 | 0101 | 0110 | 0110 | 0110 | 0110 | 0110 | 0110 |
| 10 | 0001 | 0010 | 0011 | 0100 | 0101 | 0101 | 0101 | 0101 | 0101 | 0101 |
| 11 | 0000 | 0001 | 0010 | 0011 | 0100 | 0100 | 0100 | 0100 | 0100 | 01001 |
| 12 | | 0000 | 0001 | 0010 | 0011 | 0011 | 0011 | 0011 | 00111 | 01000 |
| 13 | | | 0000 | 0001 | 0010 | 0010 | 0010 | 00101 | 00110 | 00111 |
| 14 | | | | 0000 | 0001 | 0001 | 00011 | 00100 | 00101 | 00110 |
| 15 | | | | | 0000 | 00001 | 00010 | 00011 | 00100 | 00101 |
| 16 | | | | | | 00000 | 00001 | 00010 | 00011 | 00100 |
| 17 | | | | | | | 00000 | 00001 | 00010 | 00011 |
| 18 | | | | | | | | 00000 | 00001 | 00010 |
| 19 | | | | | | | | | 00000 | 00001 |
| 20 | | | | | | | | | | 00000 | wherein every code for a certain TabIndex can be mapped to a leaf of a certain complete binary tree with a leaf number TabIndex, such as the complete binary tree code with TabIndex 9 shown in FIG. 6 and the complete binary tree code with TabIndex 18 shown in FIG. 7.

Figure 8:
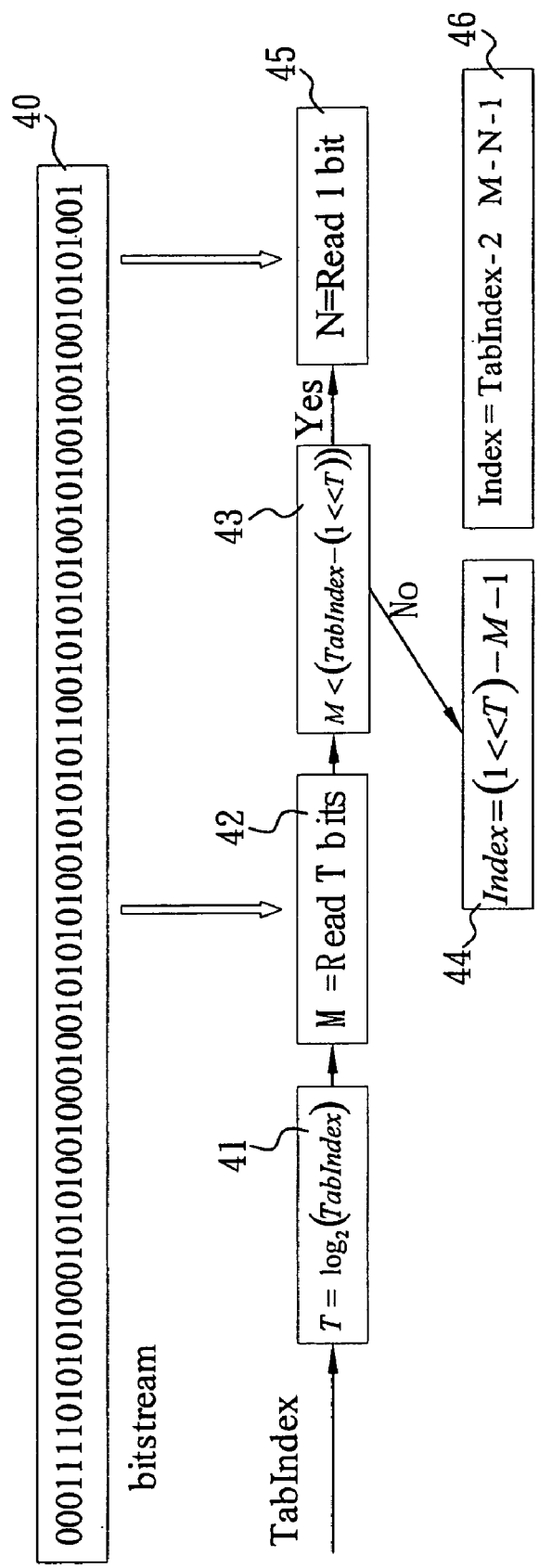
FIG. 8 is a schematic view of a decoding process of complete binary tree code.

While decoding the complete binary tree code, the decoding process is illustrated in FIG. 8 and includes the following steps:

(100) Firstly, procuring a TabIndex to calculate a value T by using the following equation in a first unit 41:

$$T=\lfloor \log_2(\text{TabIndex})\rfloor$$

(101) According to the value T obtained from the first unit 41, reading T bits from a bitstream 40 in a second unit 42, of which the result is M;

(102) Determining whether or not the result M of the second unit 42 is complied with the following condition in a third unit 43:

$$M<(\text{TabIndex}-(1<<T)),$$

if not, going to step (103); otherwise, going to step (104);

(103) Obtaining the Index in a fourth unit 44, which is equal to (1<<T)−M−1, and then ending the decoding process.

(104) Reading 1 bits from the bitstream 40 in a fifth unit 45, of which the result is N;

(105) Obtaining the Index in a sixth unit 46, which is equal to TabIndex−2×M−N−1, and then ending the decoding process.

In addition to the above decoding process, the variable length decoding method mentioned in the present invention further comprises two procedures, of which the first one is a first decoding procedure for applying to the coeffToken decoding in the H.264, the motion vector and DCT coefficient decoding in MPEG-4, etc., and the second one is a second decoding procedure for applying to the totalZeros and zeroLeft decoding in the H.264.

Figure 9:
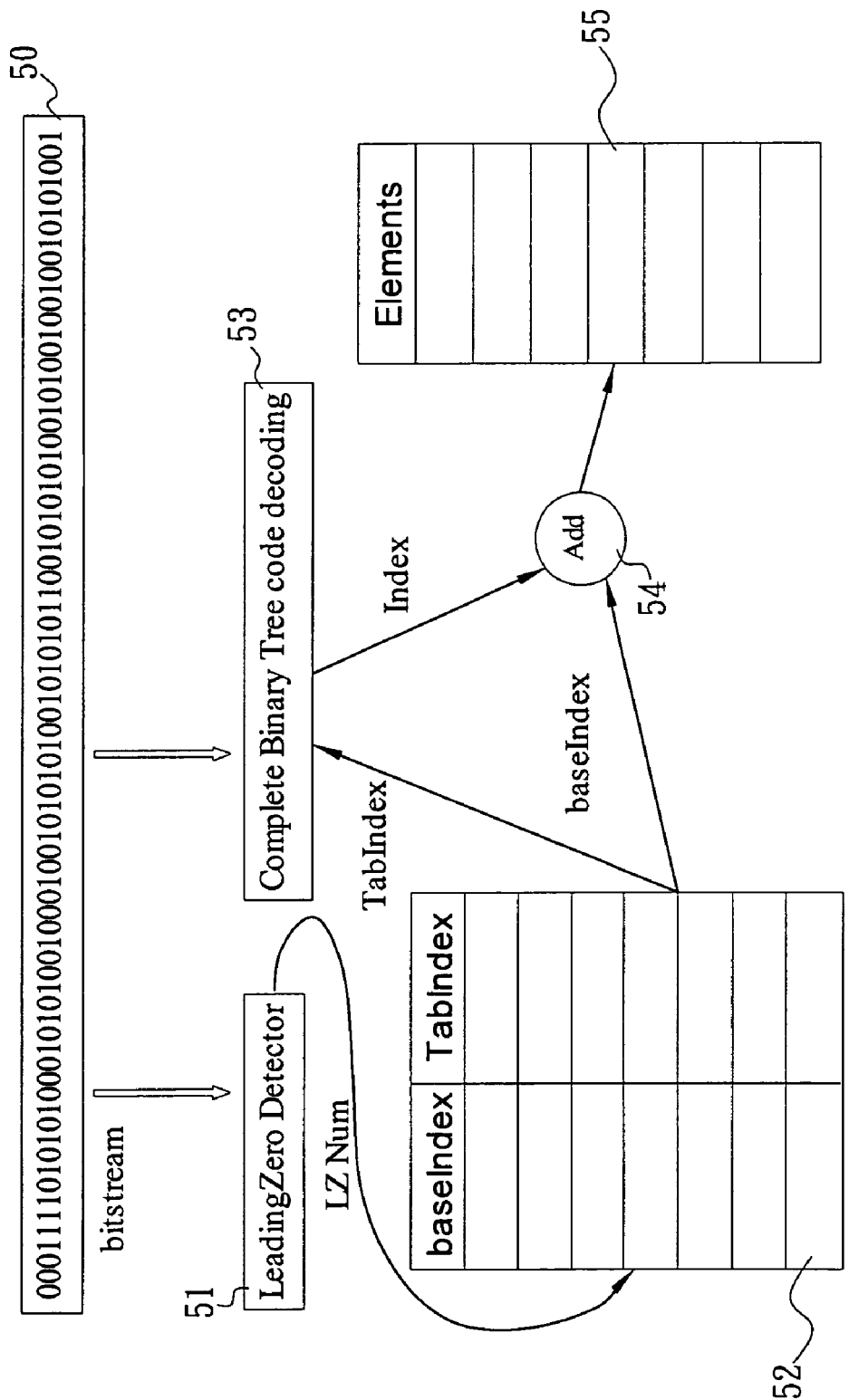
FIG. 9 is a schematic view of a first decoding process of variable length code.

Referring to FIG. 9, it illustrates the first decoding procedure of variable length code of the preferred embodiment, which comprises the steps as follows:

(200) Obtaining leading zero number, namely LZ num, from the current bitstream 50 by a first leading zero detector 51;

(201) Looking up a first table having a plurality of fields of baseIndex and TabIndex in a first instrument 52 by using the LZ Num as an index to obtain the corresponding baseIndex and TabIndex;

(202) Proceeding with the decoding process of complete binary tree code mentioned above with respect to the bitstream 50 in a first complete binary tree decoder 53 to obtain the index from the bitstream 50 according to the TabIndex procured from the first leading zero detector 51;

(203) Adding the index obtained from the decoding process 53 to the baseIndex procured from the first instrument 52 in a first addition unit 54;

(204) Looking up a second table having a plurality of fields of syntax elements in a second instrument 55 by using the addition result of the index and the baseIndex as an index to obtain the final result of the syntax elements, and then ending the procedure.

The following program is an example of the first decoding procedure for decoding the variable length code in table 3, where two tables are needed:

```
readLenStrt[3][15][2]={
    {{0,0},{0,1},{0,2},{3,3},{3,6},{4,9},{4,13},{4,17},{4,21},
{8,25},{8,33},{8,41},{8,49},{4,57},{0,61}},
    {{2,0},{3,2},{6,5},{4,11},{4,15},{4,19},{4,23},{8,27},{8,35},
```

-continued

```
{8,43},{6,51},{4,57},{0,61}},
    {{8,0},{8,8},{8,16},{8,24},{8,32},{8,40},{7,48},{4,55},
    {2,59},{0,61}}};
getnumt1[3][62]={{0,  5, 10, 15,  4,  9, 19, 14,
23,  8, 13, 18, 27, 12, 17, 22,
31, 16, 21, 26, 35, 20, 25, 30,
39, 24, 29, 34, 43, 28, 33, 38,
32, 36, 37, 42, 47, 40, 41, 46,
51, 44, 45, 50, 55, 48, 49, 54,
59, 52, 57, 58, 63, 56, 61, 62,
67, 60, 65, 66, 64, 53},
        {0,  5, 10, 15, 19,  9, 23,  4,
13, 14, 27, 8, 17, 18, 31, 12,
21, 22, 35, 16, 25, 26, 20, 24,
29, 30, 39, 28, 33, 34, 43, 32,
37, 38, 47, 36, 41, 42, 51, 40,
45, 46, 44, 48, 49, 50, 55, 52,
53, 54, 59, 56, 58, 57, 62, 60,
61, 64, 65, 66, 67, 63},
        { 0,  5, 10, 15, 19, 23, 27, 31,
9, 14, 35, 13, 18, 17, 22, 21,
4, 25, 26, 39, 8, 29, 30, 12,
16, 33, 34, 43, 20, 38, 24, 28,
32, 37, 42, 47, 36, 41, 46, 51,
40, 45, 50, 55, 44, 49, 54, 48,
53, 52, 57, 58, 59, 56, 61, 62,
63, 60, 65, 66, 67, 64}};
```

Let the tabIndex denote the code table used, the decoding process is as following:

```
Lznum=getLeadingzeros( );
baseIndex= readLenStrt[tabIndex][lznum][1];
TabIndex= readLenStrt[tabIndex][lznum][0];
If(tabIndex>0)
    Index=completeBinaryTreeDecode( );
Else
    Index=0;
coefficientNumber= getnumt1[tabIndex][Index+baseIndex]>>2;
TrailingOnes= getnumt1[tabIndex][Index+baseIndex]&3.
```

Figure 10:
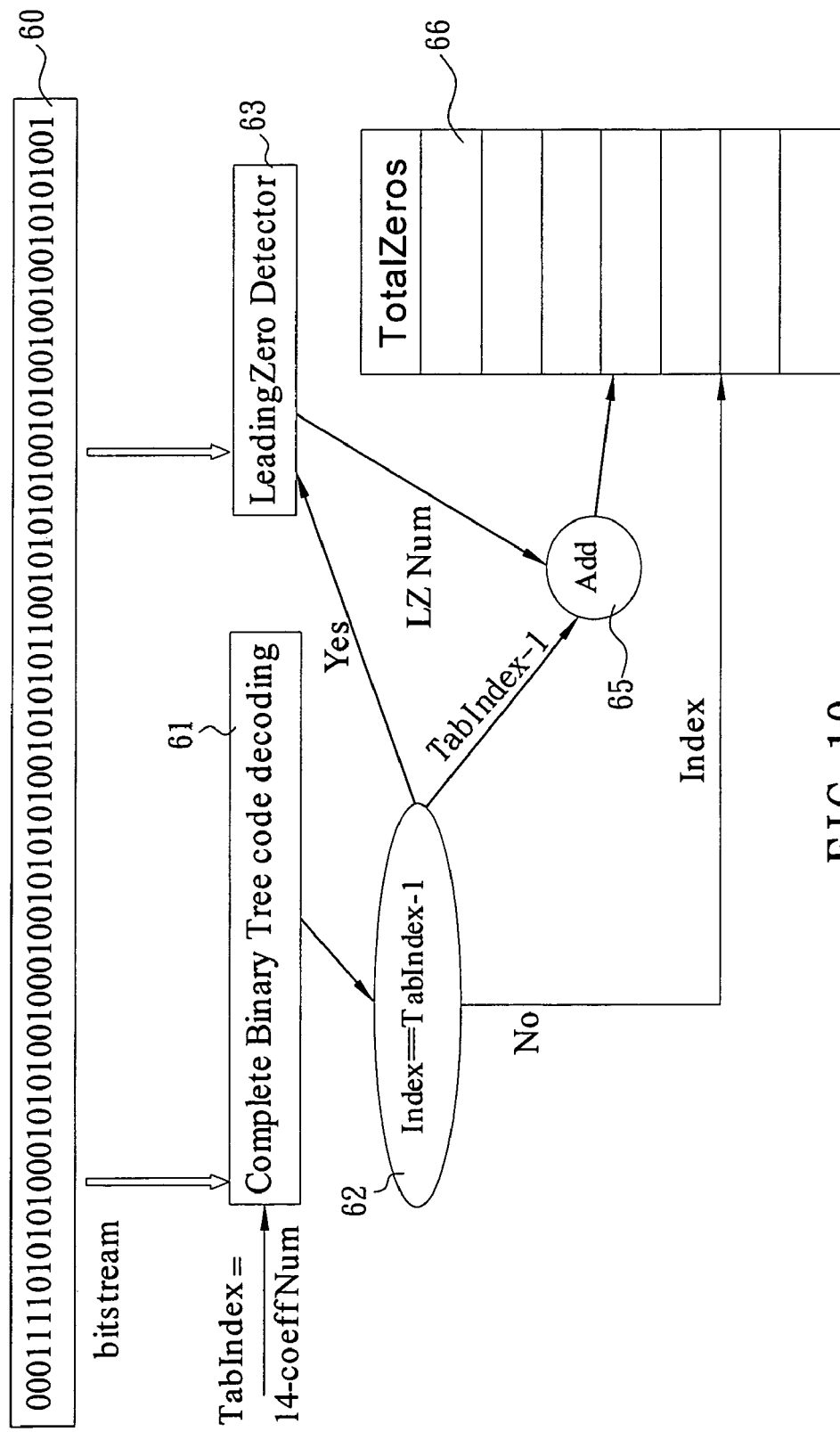
FIG. 10 is a schematic view of a second decoding process of variable length code.

Referring to FIG. 10, it illustrates the second decoding procedure of variable length code of the preferred embodiment, which comprises the following steps:

(300) Proceeding with the decoding process of complete binary tree code with respect to the bitstream 60 in a second complete binary tree decoder 61 to obtain the index from the bitstream 60 according to the TabIndex;

(301) Determining whether or not the index obtained from the second complete binary tree decoder 61 is equal to TabIndex−1 in a seventh unit 62, if not, going to step (302); otherwise, going to step (303);

(302) If the index is not equal to TabIndex−1, looking up a third table having a plurality of fields of total zeros in a third instrument 66 by using the index to obtain the final result of total zeros, and then ending the procedure;

(303) If the index is equal to TabIndex−1, obtaining leading zero number, namely LZ num, from the current bitstream 60 by a second leading zero detector 63;

(304) Adding the LZ num obtained from the second leading zero detector 63 to the index (i.e. TabIndex−1) procured from the second complete binary tree decoder 61 (or the seventh unit 62) in a second addition unit 65;

(305) Looking up the table in the third instrument 66 by using the sum of LZ num and TabIndex−1 to obtain the final result of the total zeros, and then ending the procedure.

The following program is an example of the second decoding procedure for decoding the non-zero coefficient number greater than 5 and less than 11 as follows:

```
reverseTot0_tot[6][11]={
{2,  3,  4,  5,  6,  7,  9,  8, 1,  0, 10},
{5,  2,  3,  4,  6,  8,  7,  1, 0,  9},
{4,  5,  3,  6,  7,  1,  2,  0, 8},{3,  4,  6,  5,  2,  7,  0,  1};
{3,  4,  5,  2,  6,  0,  1},{4,  5,  3,  2,  1,  0}
};
cbtCode=completeBinaryTreeDecoding(14−coeffNum);
if(cbtCode==13−coeffNum)
    cbtCode=LeadingzerosDecoding( )+12−coeffNum;
Totalzeros= reverseTot0_tot[coeffNum−6][cbtCode].
```

Summing up the above, the present invention provides a variable length decoding method, which is implemented to an entropy decoding module and comprises a first decoding procedure for applying to the coeffToken decoding in the H.264, the motion vector and DCT coefficient decoding in MPEG-4, etc., and a second decoding procedure for applying to the totalZeros and zeroLeft decoding in the H.264 so as to decode data stream of video more efficiently and fast.

While the invention herein disclosed has been described by means of specific embodiments, numerous modifications and variations could be made thereto by those skilled in the art without departing from the scope and spirit of the invention set forth in the claims.

What is claimed is:

1. A variable length decoding method for decoding complete binary tree codes, which is implemented to an entropy coding module and applying to the coeffToken decoding in the H.264 and the motion vector and to the DCT coefficient decoding in the MPEG-4, comprising the steps of:
    obtaining leading zero number, namely LZ num, from a current bitstream;
    looking up a first table having a plurality of fields of baseIndex and TabIndex by using the LZ Num as an index to obtain the baseIndex and TabIndex corresponding thereto;
    procuring the TabIndex to calculate a value $T=\lfloor \log_2(\text{TabIndex}) \rfloor$;
    reading T bits from the current bitstream to obtain a first result M;
    determining whether or not the first result M is smaller than (TabIndex-(1<<T));
    when determining that the first result M is not smaller than (TabIndex-(1<<T)), obtaining an Index equal to (1<<T)−M−1; and
    adding the Index to the baseIndex for obtaining an addition result; and
    looking up a second table having a plurality of fields of syntax elements by using the addition result as an index to obtain a final result of the syntax elements.

2. A variable length decoding method for decoding complete binary tree codes, which is implemented to an entropy coding module and applying to the coeffToken decoding in the H.264 and the motion vector and to the DCT coefficient decoding in the MPEG-4, comprising the steps of:
    obtaining leading zero number, namely LZ num, from a current bitstream;
    looking up a first table having a plurality of fields of baseIndex and TabIndex by using the LZ Num as an index to obtain the baseIndex and TabIndex corresponding thereto;
    procuring the TabIndex to calculate a value $T=\lfloor \log_2(\text{TabIndex}) \rfloor$;
    reading T bits from the current bitstream to obtain a first result M;
    determining whether or not the first result M is smaller than (TabIndex-(1<<T));
    when determining that the first result M is smaller than (TabIndex-(1<<T)), reading 1 bits from the current bitstream to obtain a second result N;
    obtaining an Index equal to TabIndex-2×M−N−1; and
    adding the Index to the baseIndex for obtaining an addition result; and
    looking up a second table having a plurality of fields of syntax elements by using the addition result as an index to obtain the final result of the syntax elements.

3. A variable length decoding method for decoding complete binary tree codes, which is implemented to an entropy coding module and applying to the totalZeros and zeroLeft decoding in the H.264, comprising the steps of:
    procuring a TabIndex to calculate a value $T=\lfloor \log_2(\text{TabIndex}) \rfloor$;
    reading T bits from a current bitstream to obtain a first result M;
    determining whether or not the first result M is smaller than (TabIndex-(1<<T));
    when determining that the first result M is not smaller than (TabIndex-(1<<T)), obtaining an Index equal to (1<<T)−M−1; and
    determining whether or not the Index is equal to TabIndex-1; and
    obtaining a final result of total zeros according to whether or not the Index is equal to TabIndex-1.

4. The method of claim 3, further includes the steps of:
    when the Index is not equal to TabIndex-1, looking up a third table having a plurality of fields of total zeros by using the Index to obtain the final result of the total zeros.

5. The method of claim 3, further includes the steps of:
    when the Index is equal to TabIndex-1, obtaining leading zero number, namely LZ num, from the current bitstream;
    adding the LZ num to the Index; and
    looking up a third table having a plurality of fields of total zeros by using the sum of LZ num and TabIndex-1 to obtain the final result of the total zeros.

6. A variable length decoding method for decoding complete binary tree codes, which is implemented to an entropy coding module and applying to the totalZeros and zeroLeft decoding in the H.264, comprising the steps of:
    procuring a TabIndex to calculate a value $T=\lfloor \log_2(\text{TabIndex}) \rfloor$;
    reading T bits from a current bitstream to obtain a first result M;
    determining whether or not the first result M is smaller than (TabIndex-(1<<T));
    when determining that the first result M is smaller than (TabIndex-(1<<T)), reading 1 bits from the bitstream to obtain a second result N;
    obtaining an Index equal to TabIndex-2×M−N−1; and
    determining whether or not the Index is equal to TabIndex-1; and
    obtaining a final result of total zeros according to whether or not the Index is equal to TabIndex-1.

7. The method of claim 6, further includes the steps of:
    when the Index is not equal to TabIndex-1, looking up a third table having a plurality of fields of total zeros by using the Index to obtain the final result of the total zeros.

8. The method of claim 6, further includes the steps of:
    when the Index is equal to TabIndex-1, obtaining leading zero number, namely LZ num, from the current bitstream;
    adding the LZ num to the Index; and
    looking up a third table having a plurality of fields of total zeros by using the sum of LZ num and TabIndex-1 to obtain the final result of the total zeros.

* * * * *